United States Patent
Kudo et al.

(10) Patent No.: US 8,194,361 B2
(45) Date of Patent: Jun. 5, 2012

(54) SPIN-TORQUE OSCILLATOR, MAGNETIC HEAD INCLUDING THE SPIN-TORQUE OSCILLATOR, AND MAGNETIC RECORDING AND REPRODUCING APPARATUS

(75) Inventors: Kiwamu Kudo, Kawasaki (JP); Tazumi Nagasawa, Yokohama (JP); Koichi Mizushima, Kamakura (JP); Rie Sato, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 800 days.

(21) Appl. No.: 12/240,042

(22) Filed: Sep. 29, 2008

(65) Prior Publication Data

US 2009/0201614 A1 Aug. 13, 2009

(30) Foreign Application Priority Data

Feb. 13, 2008 (JP) ................................ 2008-031789

(51) Int. Cl.
*G11B 5/39* (2006.01)
*G11B 5/127* (2006.01)

(52) U.S. Cl. ............. 360/324.11; 428/811.1; 428/811.2; 428/811.5

(58) Field of Classification Search .................. None
See application file for complete search history.

(56) References Cited

U.S. PATENT DOCUMENTS

| | | | | |
|---|---|---|---|---|
| 6,975,110 B2 * | 12/2005 | Kaiju et al. | ..................... | 324/252 |
| 7,224,601 B2 * | 5/2007 | Panchula | ...................... | 365/158 |
| 7,471,491 B2 * | 12/2008 | Sato et al. | ..................... | 360/313 |
| 7,616,412 B2 * | 11/2009 | Zhu et al. | ..................... | 360/324.2 |
| 7,633,699 B2 * | 12/2009 | Kaka et al. | ...................... | 360/67 |
| 7,760,472 B2 * | 7/2010 | Sato et al. | ..................... | 360/324 |
| 7,764,136 B2 * | 7/2010 | Suzuki et al. | ........... | 331/107 SL |
| 7,982,986 B2 * | 7/2011 | Sato et al. | ........................ | 360/30 |
| 2007/0259209 A1 * | 11/2007 | Slavin et al. | ................ | 428/692.1 |
| 2009/0168501 A1 * | 7/2009 | Ito | ................................... | 365/158 |
| 2010/0033881 A1 * | 2/2010 | Carey et al. | .............. | 360/324.11 |

FOREIGN PATENT DOCUMENTS

| | | |
|---|---|---|
| JP | 2006-286855 | 10/2006 |
| JP | 2006-295908 | 10/2006 |

OTHER PUBLICATIONS

Tlapurkar, A., Suzuki, Y., Fukushima, A., Kubota, H., Maehara, H., Tsunekawa, K., Djayaprawira, D., Watanabe, N., and Yuasa, S., Nature Letters, v. 438 (Nov. 17, 2005), 339-342.*
S. I. Kiselev, et al. "Microwave Oscillations of a Nanomagnet Driven by a Spin-Polarized Current", Nature, vol. 425, Sep. 25, 2003, pp. 380-383. Shehzaad Kaka, et al. "Mutual Phase-Locking of Microwave Spin Torque Nano-Oscillators", Nature, vol. 437, Sep. 15, 2005, pp. 389-392.
W. H. Rippard, et al. "Current-Driven Microwave Dynamics in Magnetic Point Contacts as a Function of Applied Field Angle", Physical Review B 70, 100406(R), 2004, pp. 100406-1 to 100406-4.
Office Action mailed Jan. 27, 2012 in Japanese Patent Application No. 2008-031789 filed Feb. 13, 2008 (in English).
X. Zhu et al. "Bias Field Free Spin Torque Driven Microwave High-Q Oscillator", Magnetics Conference, 2006, Intermag 2006, 1 page.

* cited by examiner

*Primary Examiner* — Kevin Bernatz
(74) *Attorney, Agent, or Firm* — Oblon, Spivak, McClelland, Maier & Neustadt, L.L.P.

(57) ABSTRACT

It is made possible to provide a spin-torque oscillator that has a high Q value and a high output. A spin-torque oscillator includes: an oscillating field generating unit configured to generate an oscillating field; and a magnetoresistive element including a magnetoresistive effect film including a first magnetization pinned layer of which a magnetization direction is pinned, a first magnetization free layer of which a magnetization direction oscillates with the oscillating field, and a first spacer layer interposed between the first magnetization pinned layer and the first magnetization free layer.

7 Claims, 8 Drawing Sheets

SPIN-TORQUE OSCILLATOR, MAGNETIC HEAD INCLUDING THE SPIN-TORQUE OSCILLATOR, AND MAGNETIC RECORDING AND REPRODUCING APPARATUS

CROSS-REFERENCE TO RELATED APPLICATION

This application is based upon and claims the benefit of priority from prior Japanese Patent Application No. 2008-31789 filed on Feb. 13, 2008 in Japan, the entire contents of which are incorporated herein by reference.

BACKGROUND OF THE INVENTION

1. Field of the Invention

The present invention relates to a spin-torque oscillator, a magnetic head including the spin-torque oscillator, and a magnetic recording and reproducing apparatus.

2. Related Art

It is known that a steady-state microwave signal that responses to a direct current can be generated by taking advantage of the spin transfer effect caused in a nano-scale magnetic multi-layer film having a spacer layer interposed between magnetic layers (see "Microwave oscillations of a nanomagnet driven by a spin-polarized current", S. I. Kiselev, et al., Nature 425, 380 (2003), for example). The origin of the microwave signal is an magnetization oscillation in a magnetization oscillating unit in the magnetic multi-layer film, and, on an experimental basis, a steady-state magnetization oscillation of high frequency (GHz) is detected when the current density exceeds the order of $10^7$ A/cm$^2$ in a CPP (Current Perpendicular to Plane)-GMR (Giant Magneto-Resistive effect) film or a magnetic tunnel junction (MTJ) film.

A microwave generator that uses the spin transfer effect in a magnetic multi-layer film is called a spin-torque oscillator. Thanks to the significant improvement in the microfabrication technology, it is possible to form a CPP-GMR film or a magnetic tunnel junction film of a submicron size such as 100 nm×100 nm. Spin-torque oscillators are expected to be applied to small-sized microwave sources and resonators, and are being actively studied in the field of spintronics. The frequency of a microwave signal generated from a spin-torque oscillator depends on the current and the magnetic field acting on the magnetization of the magnetization oscillating unit in the magnetic multi-layer film. Particularly, there has been a suggestion that spin-torque oscillators are used as HDD (Hard Disk Drive) magnetic sensors in place of GMR heads and TMR heads, taking advantage of the magnetic field dependency of the frequency of magnetization oscillations varying with a magnetic field (see JP-A 2006-286855(KO-KAI), for example). According to the suggestion, a magnetic field on a HDD medium is detected by sensing changes in frequency caused by the magnetic field.

A conventional spin-torque oscillator is designed to extract a microwave signal generated from an oscillation of magnetization in a magnetoresistive element unit having a ferromagnetic multi-layer film. The magnetoresistive element unit has a three-layer structure as a fundamental structure formed with a magnetization free layer, a spacer layer, and a magnetization pinned layer. When a direct current I is supplied from a power supply to the ferromagnetic multi-layer film of the magnetoresistive element unit, the magnetization M in the magnetization free layer oscillates by virtue of the spin transfer effect caused between the magnetization free layer and the magnetization pinned layer, and the angle θ of the magnetization of the magnetization free layer with respect to the magnetization of the magnetization pinned layer varies with time. As the angle θ varies, the device resistance also varies with time due to a spin-valve magnetoresistive effect, and a high-frequency voltage appears. The high-frequency component is extracted by a bias tee, so as to obtain a microwave signal P as an output.

The direct current I supplied from the power supply cannot have any value, and needs to have a larger current value than the value of a threshold current $I_c$ that depends on the structure of the magnetoresistive element unit having a ferromagnetic multi-layer film and on the magnetic field acting on the magnetoresistive element unit. A magnetization oscillation is caused in the magnetization free layer by virtue of the spin transfer effect, only if the direct current I is larger than the threshold current $I_c$. The value of the threshold current $I_c$ is determined by the cross-sectional area of the magnetoresistive element unit and the value of the threshold current density. The value of the threshold current density is of the order of $10^7$ A/cm$^2$.

There is a so-called Q value (a quality factor) that represents the properties of an oscillator. To explain an example of a Q value, an oscillator circuit that uses a crystal oscillator as resonator is now described. A crystal oscillator is known to have a high Q value of the order of $10^6$, and an oscillator circuit using a crystal oscillator as a resonator can have a Q value of the order of $10^3$ to $10^4$ to achieve stable oscillations. A Q value is a dimensionless quantity that is defined as: Q=energy stored in one cycle/power loss in one cycle (dissipation energy). As a Q value is larger, a more stable oscillation can be achieved. An oscillating state is often recognized by its frequency spectrum, and the Q value in such a case is defined as: $Q=f_0/\Delta f$, where $f_0$ represents the oscillation frequency, and $\Delta f$ represents the half-value width of the oscillation peak of the frequency spectrum. An experiment to detect an oscillating state of a spin-torque oscillator is normally carried out by measuring the frequency spectrum with a spectrum analyzer.

In a case where a spin-torque oscillator is formed with a CPP-GMR film (hereinafter also referred to as a GMR oscillation device), a nonmagnetic metal layer is used as the spacer layer of the magnetoresistive element unit. Through experiments, it is known that a GMR oscillation device can have oscillations of approximately Q~10 GHz/1 MHz~$10^4$ (see "Current-driven microwave dynamics in magnetic point contacts as a function of applied field angle", W. H. Rippard, et al., Physical Review B 70, 100406(R), (2004), for example). Accordingly, in terms of Q value, a GMR oscillation device has the same performance as or higher performance than the performance of an oscillator circuit using a crystal oscillator as a resonator. In a GMR oscillation device as a metal artificial lattice entirely formed with metal materials, the reason that a high Q value can be obtained is that a current having high current density can be supplied. It is known that the peak half-value width $\Delta f$ of the frequency spectrum is inversely proportional to the square of a current I. Accordingly, the half-value width $\Delta f$ becomes very small as a current with high current density is supplied. Thus, a high Q value can be achieved.

The high Q value is an advantage of a GMR oscillation device, but small oscillation output power P is a disadvantage of the GMR oscillation device. An output from a single GMR oscillation device is a very small amount of power of the order of nanowatts, which is far from a practical power level of microwatts, and is not suitable for practical use. The reason that an output from a GMR oscillation device is a small amount of power of the order of nanowatts is that a GMR device has a low magnetoresistance ratio (MR ratio) of several percents at most. There has been a suggestion to arrange GMR oscillation devices in an array, so as to obtain higher outputs (see "Mutual phase-locking of microwave spin torque nano-oscillators", S. Kaka, et al, Nature 437, 389 (2005), for example). To obtain microwatt outputs in the case where GMR oscillation devices are arranged in an array, however, at least several tens of single GMR oscillation devices need to be arranged in an array, and all the single GMR oscillation devices need to be synchronized. This seems to lead to difficulties in device manufacture.

In a case where a spin-torque oscillator is formed with a magnetic tunnel junction film (hereinafter referred to as a TMR oscillation device), a tunnel barrier is used as the spacer layer of the magnetoresistive element unit. In recent years, high-quality magnetic tunnel junction films with low resistance and high MR ratio have been developed, and are expected to be applied to spin-injection magnetic random access memories (Spin-RAM). Through experiments, it is known that the MR ratio of a TMR (MgO-TMR) film having a tunnel barrier made of MgO (magnesium oxide) reaches several hundreds %. A TMR oscillation device can have a large oscillation output power P, thanks to the high MR ratio. Actually, the oscillation output power of spin-torque oscillators formed with MgO-TMR films is becoming closer to the practical microwatt power level, and the presently reported maximum power is about 0.16 microwatts. In a spin-torque oscillator having a magnetic tunnel junction film such as a MgO-TMR film, however, a current with high current density cannot be supplied as in a GMR oscillation device, because there are possibilities of a dielectric breakdown of the tunnel barrier. As a result, a high Q value cannot be realized. The half-value width Δf of each TMR oscillation devices observed through experiments as of today is approximately 100 MHz. Accordingly, the Q value is approximately $10^2$, and oscillations of spin-torque oscillators formed with magnetic tunnel junction films are very unstable.

In a TMR oscillation device, a magnetization oscillation cannot be caused more often than not. This is also because of a dielectric breakdown of the tunnel barrier. As described above, a magnetization oscillation is caused in the magnetization free layer by a spin transfer effect, only if the current I is larger than the threshold current $I_c$ ($I>I_c$). Where the current I is smaller than the threshold current $I_c$ ($I<I_c$), a dielectric breakdown is often caused.

As described above, a GMR oscillation device and a TMR oscillation device each have an advantage and a disadvantage. The advantage of a GMR oscillation device is a high Q value, and the disadvantage is small oscillation output power. The advantage of a TMR oscillation device is large oscillation output power, and the disadvantage is a low Q value.

A spin-torque oscillator that is suitable for practical use in a small-sized microwave source, a resonator, a magnetic sensor, or the like is a spin-torque oscillator that has the above mentioned advantages of both a GMR oscillation device and a TMR oscillation device, or a spin-torque oscillator that is stable (having a high Q value) and has a high output (or large oscillation output power).

SUMMARY OF THE INVENTION

The present invention has been made in view of these circumstances, and an object thereof is to provide a spin-torque oscillator that has a high Q value and a high output, and a magnetic head including the spin-torque oscillator, and a magnetic recording and reproducing apparatus including the magnetic head.

A spin-torque oscillator according to a first aspect of the present invention includes: an oscillating field generating unit configured to generate an oscillating field; and a magnetoresistive element including a magnetoresistive effect film including a first magnetization pinned layer of which a magnetization direction is pinned, a first magnetization free layer of which a magnetization direction oscillates with the oscillating field, and a first spacer layer interposed between the first magnetization pinned layer and the first magnetization free layer.

A spin-torque oscillator according to a second aspect of the present invention includes: a first magnetoresistive element including a first magnetoresistive effect film comprising a first magnetization pinned layer of which a magnetization direction is pinned, a first magnetization free layer of which a magnetization direction oscillates with a supply of a direct current, and a first spacer layer interposed between the first magnetization pinned layer and the first magnetization free layer; a second magnetoresistive element including a second magnetoresistive effect film comprising a second magnetization pinned layer of which a magnetization direction is pinned, a second magnetization free layer of which a magnetization direction oscillates with a supply of a direct current, and a second spacer layer interposed between the second magnetization pinned layer and the second magnetization free layer; a spin-flip scattering layer placed between the first magnetization free layer and the second magnetization free layer, and cutting off a spin flow from the second magnetoresistive element to the first magnetoresistive element; a first electrode electrically connected to the first magnetization pinned layer; a second electrode electrically connected to the second magnetization pinned layer; and a power supply configured to supply a direct current flowing through the first magnetoresistive element, the spin-flip scattering layer, and the second magnetoresistive element via the first and second electrodes.

A magnetic head according to a third aspect of the present invention includes: a spin-torque oscillator according to any one of the first and second aspects, the spin-torque oscillator serving as a reproducing device.

A magnetic recording and reproducing apparatus according to a fourth aspect of the present invention includes: a disk driver driving a magnetic disk, and a magnetic head according to the third aspect.

DETAILED DESCRIPTION OF THE INVENTION

Figure 1:
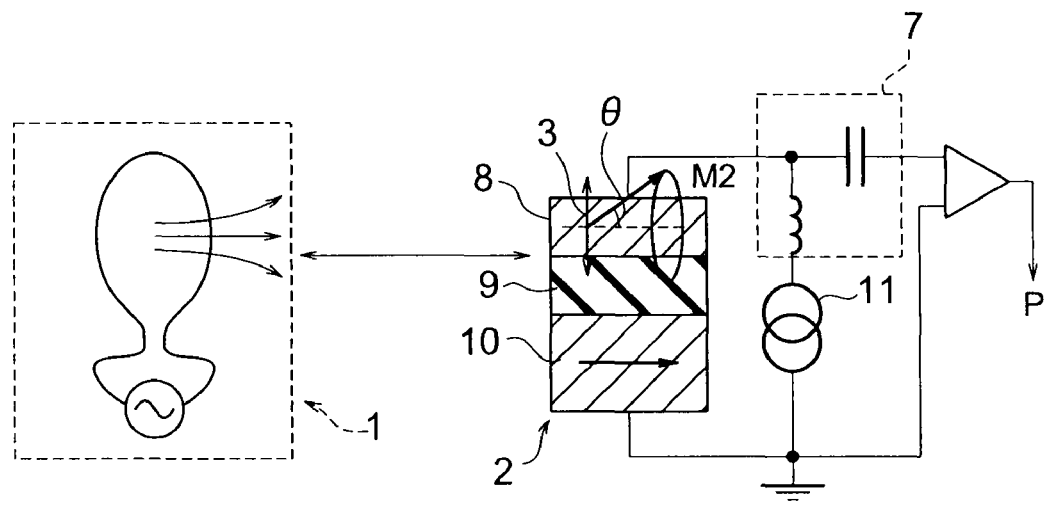
FIG. 1 is a schematic view of a spin-torque oscillator in accordance with a first embodiment.

The following is a description of embodiments of the present invention, with reference to the accompanying drawings. In the following embodiments, like components are denoted by like reference numerals, and explanation of those components is omitted. Each of the accompanying drawings is a schematic view, and the shapes, sizes, and ratios in those drawings might differ from the actual shapes, sizes, and ratios. However, when devices and the likes are actually produced, the shapes, sizes, and ratios may be changed if necessary, with the following explanation and known techniques being taken into consideration.

First Embodiment

FIG. 1 illustrates a spin-torque oscillator in accordance with a first embodiment of the present invention. The hybrid spin-torque oscillator it accordance with the first embodiment includes an oscillating field generating unit 1 and a magnetoresistive element unit 2 that has a ferromagnetic multi-layer film. The oscillating field generating unit 1 and the magnetoresistive element unit 2 are magnetostatically coupled to each other. The spin-torque oscillator may include more than one oscillating field generating unit 1. The oscillating field generating unit 1 may be any type of magnetic device such as a coil having an AC source or a conventional spin-torque oscillator, as long as the device can generate an oscillating field.

The magnetoresistive element unit 2 has a three-layer structure as a fundamental structure that is formed with a magnetization free layer 8, a spacer layer 9, and a magnetization pinned layer 10. The magnetization free layer 8 has a magnetization of which direction varies with an external magnetic field. This magnetization free layer 8 may be made of Co, Ni, Fe, or an alloy containing one of those metals. The magnetization pinned layer 10 has a magnetization of which direction is pinned. This magnetization pinned layer 10 may be formed with a film produced by joining Co, Ni, Fe, or an alloy containing one of those metals to an antiferromagnetic material such as IrMn or PtMn, and causing ferromagnetic exchange coupling or antiferromagnetic exchange coupling between the alloy and the ferromagnetic material. The magnetization pinned layer 10 may also be formed with an artificial ferri-film such as a CoFeB/Ru/CoFe film. Each of the magnetization free layer 8, the spacer layer 9, and the magnetization pinned layer 10 may not be a single layer. It is possible to employ more than one magnetization free layer 8, more than one spacer layer 9, and more than one magnetization pinned layer 10. In other words, any magnetoresistive effect film known as a GMR element or a TMR element can be used as the ferromagnetic multi-layer film of the magnetoresistive element unit 2.

When a power supply 11 supplies a direct current I to the ferromagnetic multi-layer film of the magnetoresistive element unit 2 and applies an oscillating field 3 generated from the oscillating field generating unit 1 to the ferromagnetic multi-layer film of the magnetoresistive element unit 2, magnetic resonance is caused in the magnetization M2 of the magnetization free layer 8 formed by the oscillating field 3. As a result, the relative angle θ between the magnetization M2 of the magnetization free layer 8 and the magnetization of the magnetization pinned layer 10 varies with time. Due to the spin-valve magnetoresistive effect that depends on the relative magnetization angle θ, the device resistance of the magnetoresistive element unit 2 having the ferromagnetic multi-layer film varies with time. As the relative angle θ varies, the device resistance varies with time mostly due to the spin-valve magnetoresistive effect, and an AC component formed by the device resistance variation of the magnetoresistive element unit 2 appears in the direct current supplied from the power supply 11. The AC component is extracted by a bias tee 7 formed with a capacitor and an inductor, to obtain a microwave output P.

In a case where a current I having a larger value than a threshold current value $I_c$ ($I > I_c$) is supplied to a magnetoresistive effect film, or where a high bias voltage is applied to a magnetoresistive effect film, the MR ratio is normally smaller than the MR ratio obtained in a case where a low bias voltage is applied, as it is known. Therefore, in a conventional spin-torque oscillator, the microwave output P is obtained where the MR ratio of the magnetoresistive effect film is reduced.

In the hybrid spin-torque oscillator of this embodiment, on the other hand, the magnetization M2 of the magnetization free layer 8 is resonance-excited by the oscillating field 3 generated from the oscillating field generating unit 1, as described above. Accordingly, the voltage to be applied to the ferromagnetic multi-layer film of the magnetoresistive element unit 2 by the power supply 11 can be made lower than a high bias voltage that satisfies the relationship, $I > I_c$. Thus, the MR ratio of the ferromagnetic multi-layer film of the magnetoresistive element unit 2 does not need to be reduced to extract the microwave output P from the ferromagnetic multi-layer film of the magnetoresistive element unit 2.

To effectively cause a resonance oscillation in the magnetization of the magnetization free layer 8 of the magnetoresistive element unit 2 by virtue of the oscillating field 3 generated from the oscillating field generating unit 1, as described above, the oscillation frequency of the oscillating field 3 generated from the oscillating field generating unit 1 needs to be similar to the magnetic resonance oscillation frequency characteristic in the magnetization M2 in the magnetization free layer 8. The amplitude of the oscillating field 3 should be larger than the random thermal magnetic field $H_{thermal}$ acting on the magnetization M2 in the magnetization free layer 8. The thermal magnetic field $H_{thermal}$ can be estimated by the following equation:

$$H_{thermal} = \frac{k_B T}{M_S V_{free}}$$

Here, $M_s$ represents the saturation magnetization in the magnetization free layer 8, $V_{free}$ represents the volume of the magnetization free layer 8, T represents the absolute temperature (Kelvin), and $k_B$ represents the Boltzmann constant ($k_B = 1.3807 \times 10^{-16}$ erg/K). Where $M_s$ is 600 emu/cm$^3$ and $V_{free}$ is $1.0 \times 10^5$ nm$^3$, which are typical example values, $H_{thermal}$ can be estimated to be approximately 0.69 Oe at room temperature (T=300 K). In other words, at room temperature (T=300 K), the amplitude of the oscillating field 3 generated from the oscillating field generating unit 1 needs to be larger than 0.69 Oe.

As described above, in accordance with this embodiment, the magnetization M2 of the magnetization free layer 8 is resonance-excited by the oscillating field generated from the oscillating field generating unit 1. Thus, a high Q value can be obtained. Also, the current to be supplied to the ferromagnetic multi-layer film of the magnetoresistive element unit 2 from the power supply 11 at this point may have a smaller current value than the threshold current value $I_c$. Accordingly, where the spacer layer 9 is formed with a tunnel barrier made of MgO, for example, a dielectric breakdown is not caused, and a high output can be achieved. The spacer layer 9 may not be a tunnel barrier made of MgO, but may be made of a non-magnetic metal, as long as a high output can be obtained.

Second Embodiment

Figure 2:
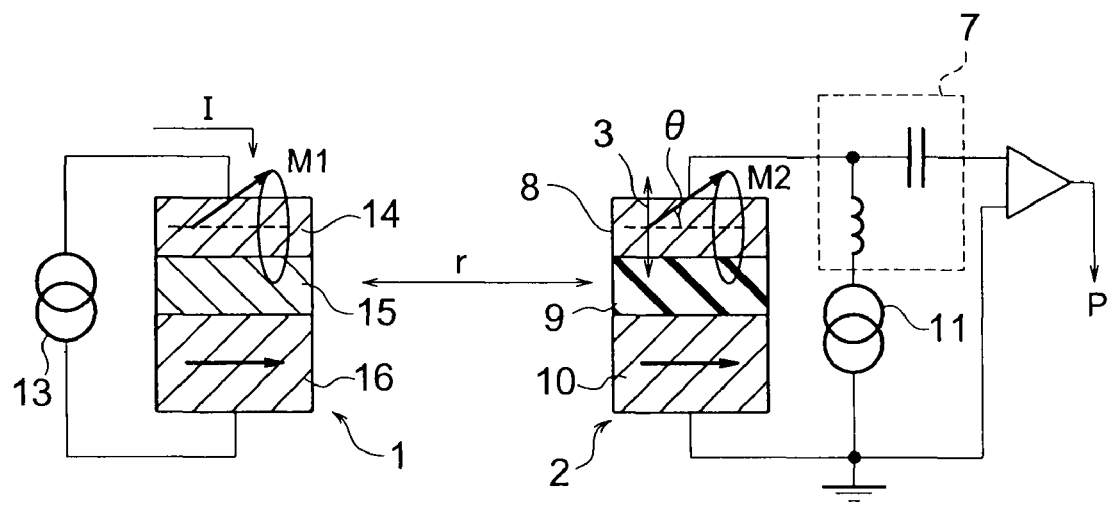
FIG. 2 is a schematic view of a spin-torque oscillator in accordance with any of second to fourth embodiments.

FIG. 2 illustrates a spin-torque oscillator in accordance with a second embodiment of the present invention. The spin-torque oscillator in accordance with this embodiment is the same as the spin-torque oscillator of the first embodiment shown in FIG. 1, except that the oscillating field generating unit 1 is a CPP-GMR device that has a three-layer structure formed with a magnetization free layer 14, a spacer layer 15, and a magnetization pinned layer 16. The current I to be supplied by a power supply 13 is large enough to oscillate the magnetization M1 in the magnetization free layer 14, using a spin transfer effect. Therefore, the oscillating field generating unit 1 has a similar structure to a conventional GMR oscillation device. The oscillating field 3 generated from the oscillating field generating unit 1 is an oscillating dipole field formed by the oscillation of the magnetization M1 of the magnetization free layer 14. The oscillating dipole field formed by the magnetization M1 causes magnetic resonance in the magnetization M2 of the magnetization free layer 8 of the magnetoresistive element unit 2.

In this embodiment, a magnetic oscillation having a high Q value can be obtained from the oscillating field generating unit 1 formed with a GMR oscillation device. Accordingly, this embodiment has the advantage that an oscillating dipole field having a stable high Q value can be obtained from the oscillating field generating unit 1 formed with a GMR oscillation device. Furthermore, a GMR oscillation device can be formed in sub-microns. Accordingly, the oscillating field generating unit 1 can be formed in sub-microns, and the spin-torque oscillator of this embodiment can be minute in size. As for the oscillating field 3 generated from the oscillating field generating unit 1, the size of the oscillating dipole field $H_{dip}$ can be estimated by the following equation (1):

$$H_{dip} = \frac{4\pi M_S V_{free}}{r^3} \qquad (1)$$

Here, $M_s$ represents the saturation magnetization of the magnetization free layer 14, $V_{free}$ represents the volume of the magnetization free layer 14, r represents the distance between the oscillating field generating unit 1 and the ferromagnetic multi-layer film of the magnetoresistive element unit 2. Where $M_s$ is $10^3$ emu/cm$^3$, $V_{free}$ is $10^5$ nm$^3$, and the distance r is 300 nm, which are typical values in a GMR oscillation device, the oscillating dipole field $H_{dip}$ can be estimated to be approximately 50 Oe. This oscillating dipole field $H_{dip}$ is large enough to cause magnetic resonance in the magnetization M2 of the ferromagnetic multi-layer film of the magnetoresistive element unit 2, but the oscillating dipole field $H_{dip}$ should preferably be larger than that to cause a greater magnetization oscillation in the magnetization M2 through the magnetic resonance. According to the equation (1), the oscillating dipole field $H_{dip}$ becomes larger as the distance r becomes shorter. Therefore, to cause a large magnetization oscillation in the magnetization M2 through magnetic resonance, it is preferable to restrict the distance r (>0) to a small value.

To effectively cause a resonance oscillation in the magnetization of the magnetization free layer 8 of the magnetoresistive element unit 2, the oscillation frequency of the oscillating field 3 generated from the oscillating field generating unit 1 should preferably be similar to the magnetic resonance oscillation frequency inherent in the magnetization in the magnetization free layer 8.

As described above, this embodiment can achieve a high Q value and a high output, like the first embodiment.

Third Embodiment

Referring again to FIG. 2, a spin-torque oscillator in accordance with a third embodiment of the present invention is described. The spin-torque oscillator in accordance with this embodiment is the same as the spin-torque oscillator of the second embodiment, except that the magnetoresistive element unit 2 is formed with a magnetic tunnel junction (MTJ) device.

In a conventional TMR oscillation device, a large amount of current cannot be supplied, so as to avoid the problem of a dielectric breakdown. As a result, only an unstable oscillation (a low Q value) is obtained as the oscillation of the magnetization M2 of the magnetization free layer 8.

In the spin-torque oscillator of this embodiment, on the other hand, the oscillation of the magnetization M2 of the magnetization free layer 8 is caused by the oscillating field generated from the oscillating field generating unit 1. Accordingly, a large amount of current is not required to obtain a high Q value. To achieve an oscillation of a high Q value, a stable oscillating field should be used. Where a large amount of current is not required, a low voltage suffices as the bias voltage to be applied by the DC power supply 11 to the ferromagnetic multi-layer film of the magnetoresistive element unit 2 formed with a MTJ device.

It is well known that the MR ratio of a MTJ device is dependent on bias voltage, and the MR ratio becomes smaller as the bias voltage becomes higher. Since the oscillation output power P is proportional to the square of the MR ratio, it is preferable that the power P is extracted at such a bias voltage as not to degrade the MR ratio. Unlike a conventional TMR oscillation device, the spin-torque oscillator of this embodiment does not have a threshold bias voltage value, and any bias voltage value may be applied by the power supply 11 to extract the oscillation power P. Accordingly, the power P can be extracted at such a bias voltage as not to degrade the MR ratio. To obtain high-power microwaves in this embodiment, the spacer layer 9 of the MTJ device serving as the magnetoresistive element unit 2 should preferably be formed with a tunnel barrier made of MgO (magnesium oxide).

It is known that, in a conventional TMR oscillation device, the spin transfer torque acting on the magnetization free layer is larger in a case where a bias voltage is applied in such a manner that the current flows from the magnetization free layer to the magnetization pinned layer, than in a case where the bias voltage is applied in such a manner that the current flows from the magnetization pinned layer to the magnetization free layer (known as the bias-voltage asymmetric properties of spin transfer torque). In a conventional MTJ oscillation device, a spin transfer torque causes an oscillation. In the spin-torque oscillator of this embodiment, however, a spin transfer torque from the DC power supply 11 might cause noise (spin transfer noise). Therefore, the direction of the current to be supplied from the DC power supply 11 should be from the magnetization pinned layer 10 to the magnetization free layer 8, so as to restrain spin transfer noise and prevent the oscillation stability from deteriorating.

Like the second embodiment, this embodiment can also achieve a high Q value and a high output, as described above.

Fourth Embodiment

Referring again to FIG. 2, a spin-torque oscillator in accordance with a fourth embodiment of the present invention is described. The spin-torque oscillator in accordance with this embodiment is the same as the spin-torque oscillator of the second or third embodiment, except that the volume of a first magnetization oscillating unit of the oscillating field generating unit 1 is larger than the volume of a second magnetization oscillating unit of the magnetoresistive element unit 2 formed with a ferromagnetic multi-layer film. FIG. 2 does not clearly show the difference in volume. The first magnetization oscillating unit is equivalent to the portion that has a magnetization oscillation in the magnetization free layer 14, and the second magnetization oscillating unit is equivalent to the portion that has a magnetization oscillation in the magnetization free layer 8.

The oscillation mechanism in the spin-torque oscillator of this embodiment is that the magnetization oscillation of M2 is excited by the oscillating field generating from the first magnetization oscillating unit which acts on the magnetization M2 in the second magnetization oscillating unit. Since the volume of the first magnetization oscillating unit is larger than the volume of the second magnetization oscillating unit in the spin-torque oscillator of this embodiment, the oscillating field generated from the first magnetization oscillating unit effectively acts on the magnetization M2 in the second magnetization oscillating unit, so as to oscillate the magnetization M2 with large amplitude. Thus, a large oscillation output power P can be obtained.

When the oscillating field acts on the magnetization M2 in the second magnetization oscillating unit, the magnetic flux $\Phi$ from the first magnetization oscillating unit flows into the second magnetization oscillating unit. The magnetic flux $\Phi$ is expressed as $\Phi=B_1 S_1$, where $B_1$ represents the oscillating field generated from the magnetization M1, and $S_1$ represents the surface area surrounding the first magnetization oscillating unit. The magnetic flux $\Phi$ flowing into the second magnetization oscillating unit is expressed as $\Phi=B_2 S_2$, where $B_2$ represents the oscillating field acting on the magnetization M2, and $S_2$ represents the surface area surrounding the second magnetization oscillating unit. In a case where the volume of the first magnetization oscillating unit is larger than the volume of the second magnetization oscillating unit, $S_1$ is larger than $S_2$, and accordingly, $B_1$ is smaller than $B_2$. Since the volume of the first magnetization oscillating unit is larger than the volume of the second magnetization oscillating unit in the spin-torque oscillator of this embodiment, the oscillating field acting on the magnetization M2 in the second magnetization oscillating unit becomes larger, and it is possible to oscillate the magnetization M2 with large amplitude.

Like the second and third embodiments, this embodiment can also achieve a high Q value and a high output.

In each of the spin-torque oscillators in accordance with the second to fourth embodiments, the power supply 13 for activating the oscillating field generating unit 1 is provided separately from the power supply 11 for activating the magnetoresistive element unit 2. Accordingly, appropriate voltage values can be set for both the oscillating field generating unit 1 and the magnetoresistive element unit 2. Particularly, the power supply 11 for activating the ferromagnetic multi-layer film of the magnetoresistive element unit 2 involves microwave output values, and can set appropriate voltage values for applications, or appropriate microwave output values, when the spin-torque oscillators of the second to fourth embodiments are used in small-sized microwave sources, resonators, magnetic sensors, and the likes.

Fifth Embodiment

Figure 3:
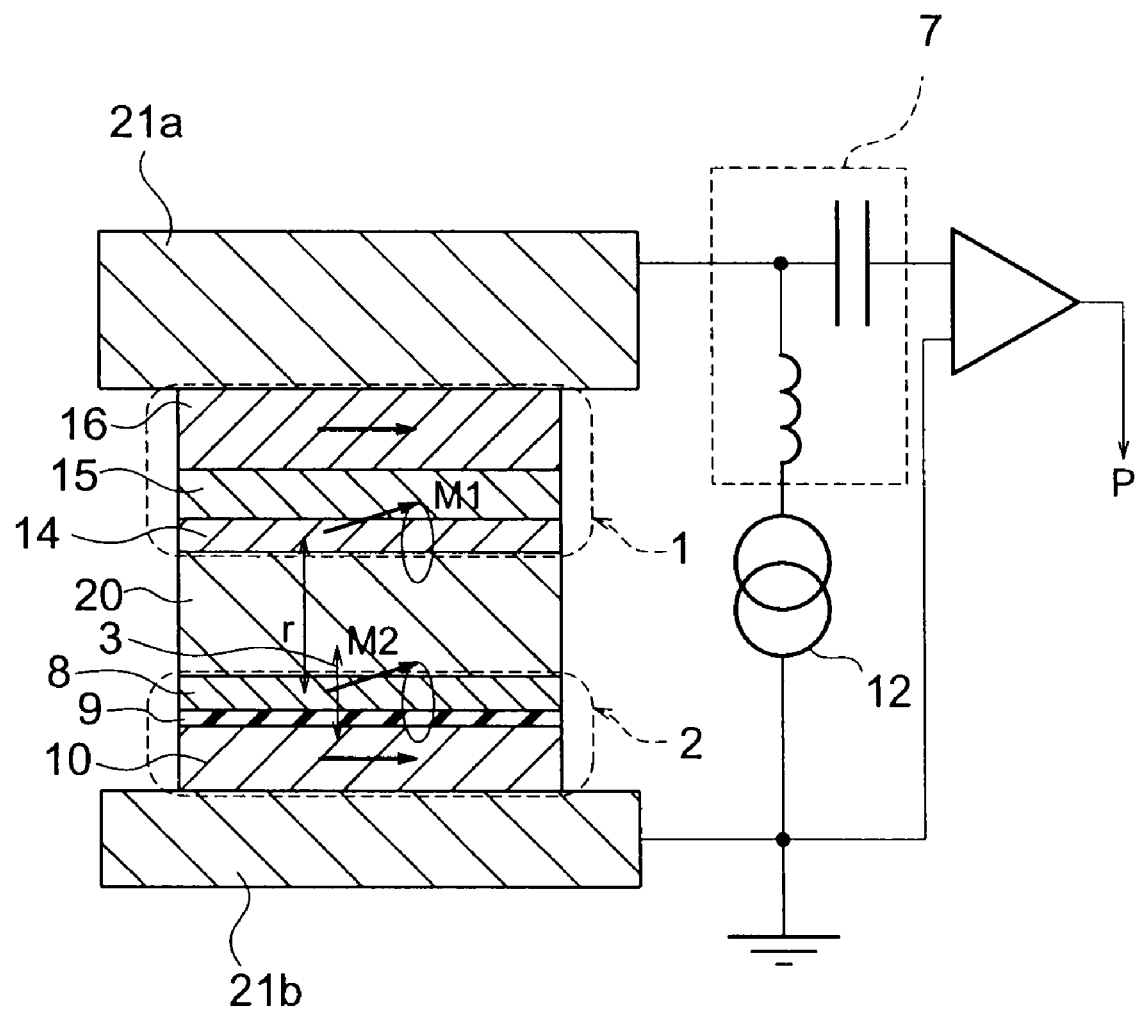
FIG. 3 is a schematic view of a spin-torque oscillator in accordance with a fifth embodiment.

FIG. 3 illustrates a spin-torque oscillator in accordance with a fifth embodiment of the present invention. The spin-torque oscillator of this embodiment includes an oscillating field generating unit 1, a magnetoresistive element unit 2 formed with a ferromagnetic multi-layer film, a bias tee 7, a DC power supply 12, a random spin-flip scattering layer 20, and a pair of electrodes 21a and 21b for energizing those components. The oscillating field generating unit 1 includes a magnetization free layer 14, a spacer layer 15, and a magnetization pinned layer 16. The magnetization free layer 14 is electrically connected to the random spin-flip scattering layer 20, and the magnetization pinned layer 16 is electrically connected to the electrode 21a. The magnetoresistive element unit 2 includes a magnetization free layer 8, a spacer layer 9, and a magnetization pinned layer 10. The magnetization free layer 8 is electrically connected to the random spin-flip scattering layer 20, and the magnetization pinned layer 10 is electrically connected to the electrode 21b. The DC power supply 12 supplies a direct current to the spin-torque oscillator of this embodiment via the electrodes 21a and 21b.

The random spin-flip scattering layer 20 plays the role of electrically coupling the oscillating field generating unit 1 to the magnetoresistive element unit 2 formed with a ferromagnetic multi-layer film, and the role of cutting off the spin flow between the oscillating field generating unit 1 and the magnetoresistive element unit 2 formed with a ferromagnetic multi-layer film. Since the spin flow between the oscillating field generating unit 1 and the magnetoresistive element unit 2 formed with a ferromagnetic multi-layer film is cut off by the random spin-flip scattering layer 20, there is not a spin transfer effect caused between the oscillating field generating unit 1 and the magnetoresistive element unit 2 formed with a ferromagnetic multi-layer film, and spin transfer noise in the magnetoresistive element unit 2 formed with a ferromagnetic multi-layer film can be prevented. The spin-flip scattering layer 20 may be made of any conductive material (such as Cu). In such a case, however, the layer thickness of the spin-flip scattering layer 20 needs to be larger than the spin diffusion length $I_{sf}$. The spin diffusion length $I_{sf}$ indicates the distance at which the conductive electron spin relaxes and changes directions. It is known that the spin diffusion length $I_{sf}$ is within the range of several nanometers to several hundreds of nanometers in almost any material. When spin-polarized electrons that original have a spin polarization rate P (for example, P is 1 in a complexly polarized material such as a half metal, and P is approximately 0.4 in Fe) is carried over a distance almost equal to the spin diffusion length $I_{sf}$, the spin polarization rate P decreases to 0. Since a spin transfer effect is proportional to P, the spin polarization rate of the conductive electrons between the oscillating field generating unit 1 and the magnetoresistive element unit 2 formed with a ferromagnetic multi-layer film is low, if the layer thickness of the spin-flip scattering layer 20 is larger than the spin diffusion length $I_{sf}$, and the spin transfer effect between the oscillating field generating unit 1 and the magnetoresistive element unit 2 formed with a ferromagnetic multi-layer film vanishes. For simplification of film formation, it is preferable that the spin diffusion length $I_{sf}$ is small. In such a case, a spin-flip scattering substance should be buried in a conductive material. The spin-flip scattering substance may be a magnetic impurity (such as Mn).

Next, the oscillation mechanism of the spin-torque oscillator of this embodiment is described. The DC power supply 12 supplies a current I to the spin-torque oscillator of this embodiment via the pair of electrodes 21a and 21b. With the current I, a spin transfer effect is caused between the magnetization pinned layer 16 and the magnetization free layer 14, and the magnetization M1 in the magnetization free layer 14 oscillates. However, the value of the current I needs to be large enough to cause the oscillation of the magnetization M1 ($I>I_c$). The oscillation of the magnetization M1 generates an oscillating dipole field, and the oscillating dipole field acts on the magnetization M2 of the magnetization free layer 8 to oscillate by virtue of a magnetic resonance effect. The oscillation power P is obtained as a consequence of each of the following magnetoresistive effects: the spin-valve magnetoresistive effect between the magnetization pinned layer 16 and the magnetization free layer 14 in the oscillating field generating unit 1; and the spin-valve magnetoresistive effect between the magnetization pinned layer 10 and the magnetization free layer 8 in the magnetoresistive element unit 2 formed with a ferromagnetic multi-layer film.

Next, the fact that the oscillation power P is a large oscillation power and has a high Q value is described. In a case where the spacer layer 15 is a nonmagnetic metal layer, and the spacer layer is a tunnel barrier, the oscillation power P can be maximized, and a high Q value can be achieved. In this case, the oscillating field generating unit 1 has a CPP-GMR device structure, and the magnetoresistive element unit 2 formed with a ferromagnetic multi-layer film has a TMR device structure. Since the oscillating field generating unit 1 has a CPP-GMR device structure, the oscillation of the magnetization M1 of the magnetization free layer 14 caused by a spin transfer effect is a stable oscillation with a high Q value, and the oscillating field 3 generated through the oscillation of the magnetization M1 also has a high Q value. The oscillation of the magnetization M2 of the magnetization free layer 8 caused by the oscillating field 3 having the high Q value also has a high Q value.

When a CPP-GMR device and a TMR device are compared with each other, the spin-valve magnetoresistive effect of the TMR device is much larger than the spin-valve magnetoresistive effect of the CPP-GMR device, particularly if the TMR device has a tunnel barrier made of MgO. While the MR ratio of a CPP-GMR device is several % at most, the MR ratio of a TMR device is several hundreds of percents. Accordingly, the oscillation output power P is determined by the spin-valve magnetoresistive effect of the magnetoresistive element unit 2 formed with a ferromagnetic multi-layer film, and a large oscillation power P reflecting the large MR ratio of several hundreds of percents can be achieved.

As described above, this embodiment can achieve a high Q value and a high output.

Sixth Embodiment

Figure 4:
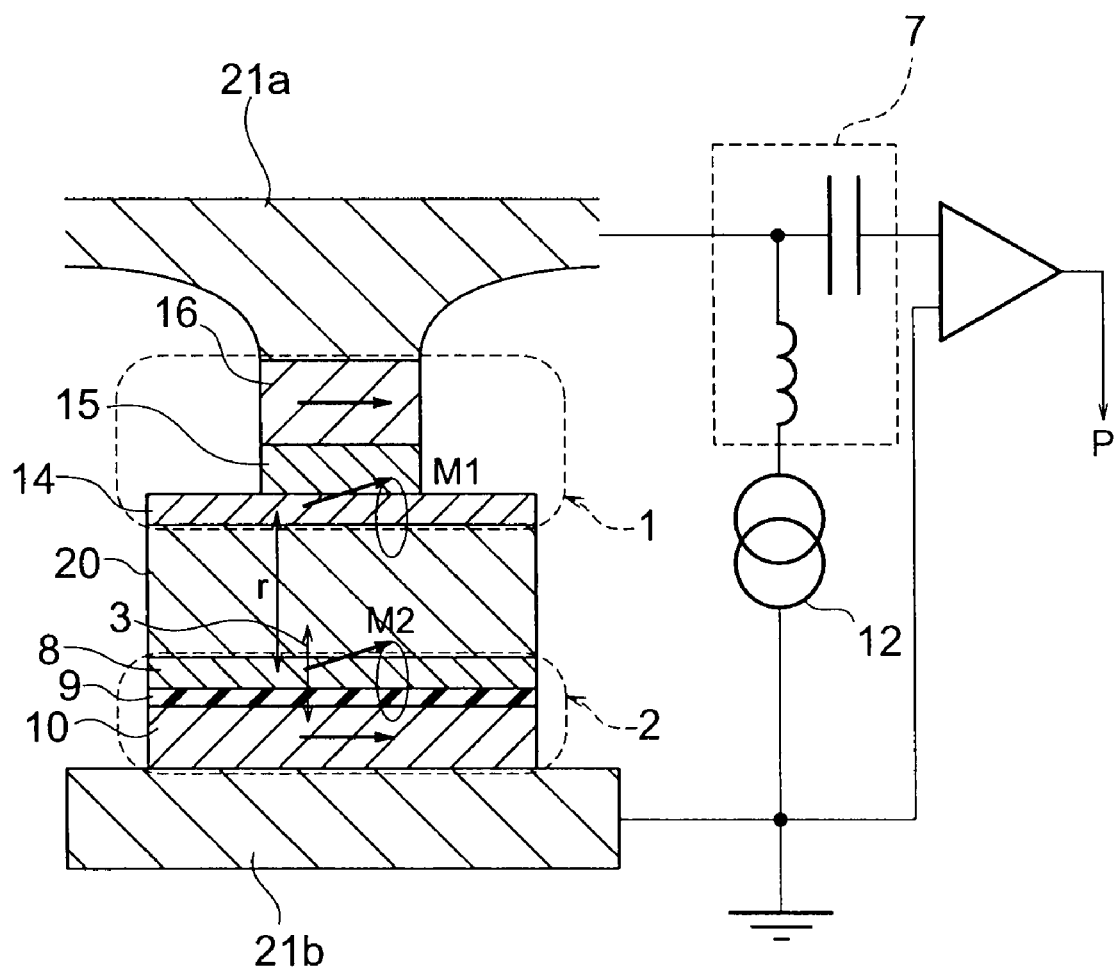
FIG. 4 is a schematic view of a spin-torque oscillator in accordance with a sixth embodiment.

FIG. 4 illustrates a spin-torque oscillator in accordance with a sixth embodiment of the present invention. The spin-torque oscillator in accordance with this embodiment is the same as the spin-torque oscillator of the fifth embodiment shown in FIG. 3, except that the oscillating field generating unit 1 and the magnetoresistive element unit 2 formed with a ferromagnetic multi-layer film are designed so that the current density value of the current supplied from the pair of electrodes 21a and 21b is smaller in the magnetoresistive element unit 2 formed with a ferromagnetic multi-layer film than in the oscillating field generating unit 1. In this embodiment, each of the cross-sectional areas of the spacer layer 15 and the magnetization pinned layer 16 of the oscillating field generating unit 1 (or the areas of the layer surfaces) is smaller than each of the cross-sectional areas of the spacer layer 9, the magnetization pinned layer 10, and the random spin-flip scattering layer 20 (or the areas of upper faces or lower faces of the layers). Accordingly, the current density value of the current flowing into the magnetization free layer 14 is larger than the current density value of the current flowing into the magnetization free layer 8. Since a spin transfer effect is proportional to a current density value, the spin transfer effect between the magnetization free layer 8 and the magnetization pinned layer 10 can be made smaller than the spin transfer effect between the magnetization free layer 14 and the magnetization pinned layer 16, in terms of the contribution of current density. In this embodiment, the electrode 21a electrically connected to the magnetization pinned layer 16 has a pillar shape.

As described above, in the spin-torque oscillator of this embodiment, the spin transfer effect between the magnetization free layer 8 and the magnetization pinned layer 10 is restrained, and spin transfer noise due to an oscillation of the magnetization M2 of the magnetization free layer 8 can be reduced. Thus, degradation of the Q value due to spin transfer noise can be prevented.

Like the fifth embodiment, this embodiment can also achieve a high Q value and a high output.

Seventh Embodiment

Figure 5:
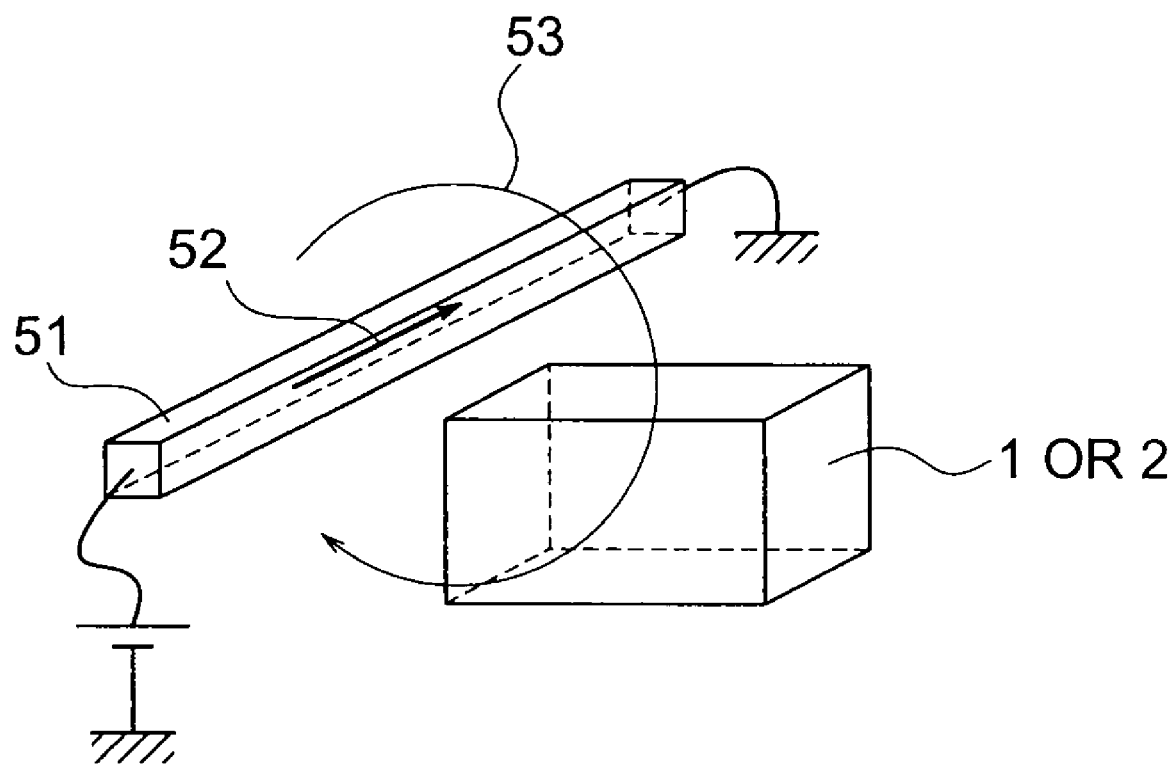
FIG. 5 is a schematic view of a spin-torque oscillator in accordance with a seventh embodiment.

Referring now to FIG. 5, a spin-torque oscillator in accordance with a seventh embodiment of the present invention is described. The spin-torque oscillator of this embodiment is the same as any of the spin-torque oscillator of the second to fourth embodiments, except that magnetostatic field applying units are added to the structure.

In a case where a GMR oscillation device is used as the oscillating field generating unit 1 as in any of the spin-torque oscillators of the second to fourth embodiments, the frequency of the oscillating field depends on the magnetic field felt by the magnetization of the magnetization free layer 14 of the GMR device. The frequency of the microwave from the magnetoresistive element unit 2 formed with a ferromagnetic multi-layer film also depends on the magnetic field felt by the magnetization of the magnetization free layer 8 of the ferromagnetic multi-layer film in the magnetoresistive element unit 2. Accordingly, with the magnetostatic field applying unit that applies a magnetostatic field to the magnetization free layer 14 of the GMR oscillation device as the oscillating field generating unit 1, the frequency of the oscillating field can be adjusted. Also, with the magnetostatic field applying unit that applies a magnetostatic field to the magnetization free layer 8 of the ferromagnetic multi-layer film of the magnetoresistive element unit 2, the frequency of the oscillating microwave can be adjusted.

To generate a magnetostatic field acting on a free magnetic layer, a wire 51 is placed in the vicinity of the oscillating field generating unit 1 or the ferromagnetic multi-layer film of the magnetoresistive element unit 2, particularly near the magnetization free layer of either of the units, and a direct current 52 is supplied to the wire 51. By virtue of the direct current 52, a static ampere magnetic field 53 acts on the oscillating field generating unit 1 or the magnetoresistive element unit 2 formed with a ferromagnetic multi-layer film. The wire 51 may be similar to a write wire in a current-field-writable MRAM. Where R [μm] represents the distance from the wire 51 to the oscillating field generating unit 1 or the ferromagnetic multi-layer film of the magnetoresistive element unit 2, and I [A] represents the current value of the direct current 52, the intensity $H_{amp}$ [Oe] of the ampere magnetic field 53 can be estimated by the following equation:

$$H_{amp}[\text{Oe}] = I[\text{A}] \times 10^3 \times \frac{1}{R[\mu m]}$$

As is apparent from this equation, the intensity $H_{amp}$ of the ampere magnetic field 53 varies with the current value I. Therefore, the current value should be set at an appropriate value, while the intensity $H_{amp}$ of the ampere magnetic field 53 is set at a desired value. For example, where R is 0.5 [μm] and I is $5.0 \times 10^{-3}$ [A], $H_{amp}$ is 10 [Oe]. By adjusting $H_{amp}$, the frequency of the oscillating field or the oscillating microwave can be adjusted by approximately $\gamma H_{amp}/(2\pi)$, which is approximately 28 MHz. In this manner, the frequency of the oscillating field is adjusted by a magnetostatic field to the magnetic resonance frequency inherent in the magnetization M2 of the magnetization free layer of the magnetoresistive element unit 2. By doing so, the magnetization M2 of the magnetization free layer of the magnetoresistive element unit 2 can be effectively oscillated with large amplitude by the oscillating field. Since the frequency of the oscillating microwave can also be adjusted by a magnetostatic field, a microwave having a suitable frequency for each purpose can be obtained from the spin-torque oscillator of this embodiment.

Like the second to fourth embodiments, this embodiment can also achieve a high Q value and a high output.

Eighth Embodiment

Figure 6:
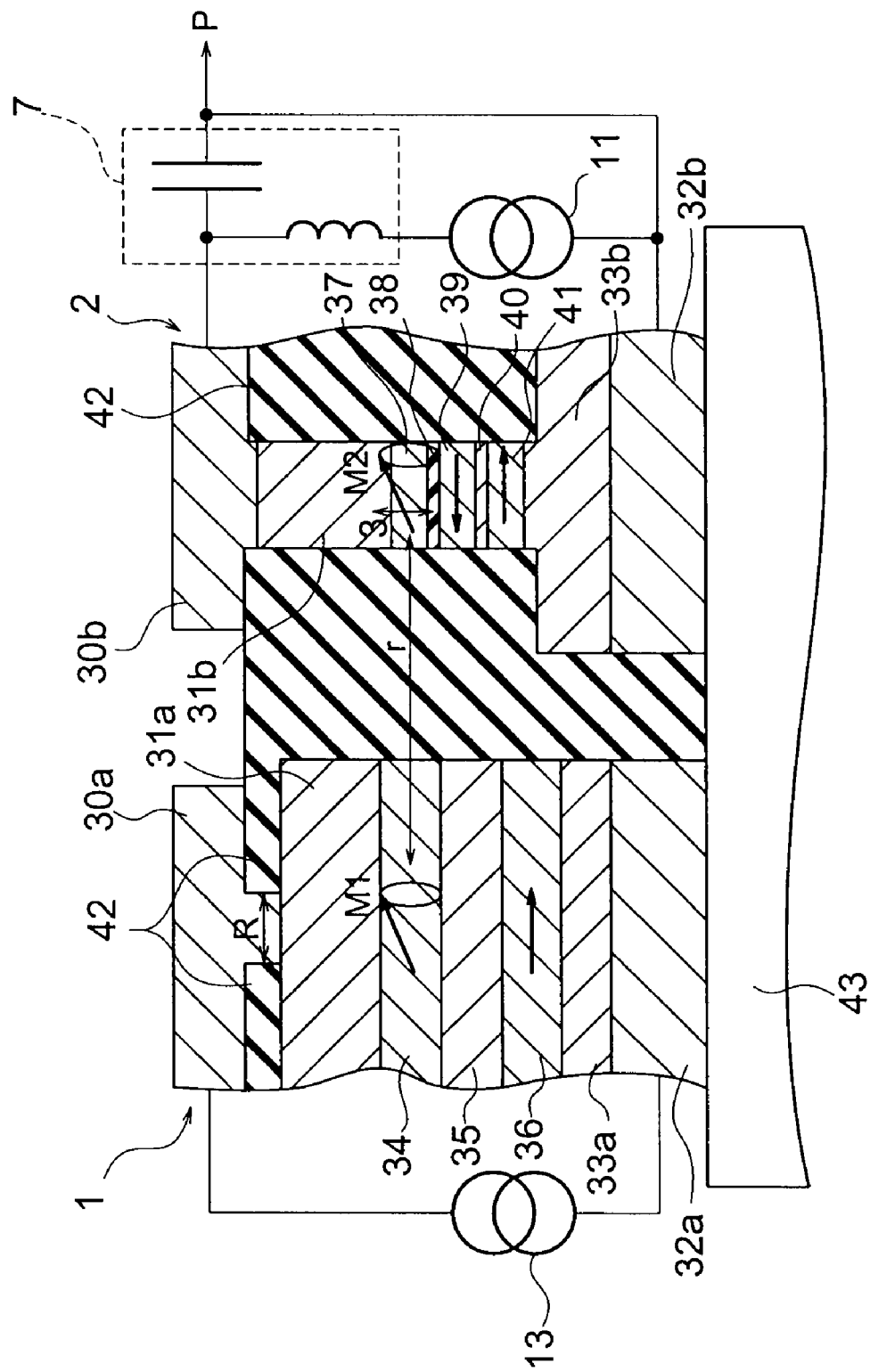
FIG. 6 is a schematic view of a spin-torque oscillator in accordance with an eighth embodiment.

FIG. 6 illustrates a spin-torque oscillator in accordance with an eighth embodiment of the present invention. As shown in FIG. 6, the spin-torque oscillator in accordance with this embodiment includes an oscillating field generating unit 1, a magnetoresistive element unit 2 formed with a ferromagnetic multi-layer film, a bias tee 7 formed with an inductor and a capacitor, and DC power supplies 11 and 13. Those components of the spin-torque oscillator are formed on a substrate 43. The oscillating field generating unit 1 and the magnetoresistive element unit 2 formed with a ferromagnetic multi-layer film are spatially partitioned by an insulator 42, and the magnetization oscillating units of the oscillating field generating unit 1 and the magnetoresistive element unit 2 are at a distance r that is approximately 250 nm from each other. This distance r is the distance between the centers of the two magnetization oscillating units. Although the distance r should be minimized, the distance r in this embodiment is set at an appropriate value that allows easy device manufacture.

The oscillating field generating unit 1 includes: a lower electrode 32a formed on the substrate 43; an antiferromagnetic layer 33a that is formed on the lower electrode 32a and is made of IrMn; a magnetization pinned layer 36 that is formed on the antiferromagnetic layer 33a and is made of CoFe; a nonmagnetic spacer layer 35 that is formed on the magnetization pinned layer 36 and is made of Cu; a magnetization free layer 34 that is formed on the nonmagnetic spacer layer 35 and is made of NiFe; a cap layer 31a that is formed on the magnetization free layer 34; and an upper electrode 30a that is formed on the cap layer 31a. The lower electrode 32a may be a two-layer stack film formed with a Cu layer and a Ta layer, for example. The upper electrode 30a may be made of Au, for example. The upper electrode 30a in the oscillating field generating unit 1 has a size-R point contact formed by an insulating layer 42. The size R is approximately 100 nm.

The point contact is provided to increase the current density of the current supplied from a power supply 13 to the stack film formed with the magnetization free layer 34, the nonmagnetic spacer layer 35, and the magnetization pinned layer 36. With higher current density, the spin transfer effect between the magnetization M1 in the magnetization free layer 34 and the fixed magnetization in the magnetization pinned layer 36 becomes greater, and the magnetization M1 in the magnetization free layer 34 oscillates by the spin transfer effect. The oscillating field generating unit 1 has a structure similar to a conventional spin-torque nano-contact oscillator. Since the oscillating field generating unit 1 has a so-called CPP-GMR oscillation device structure having a spacer layer made of the nonmagnetic metal Cu, the Q value of the oscillation of the magnetization M1 is as high as $10^4$.

The magnetoresistive element unit 2 formed with a ferromagnetic multi-layer film includes: a lower electrode 32b formed on the substrate 43; an antiferromagnetic layer 33b that is formed on the lower electrode 32b and is made of IrMn; a CoFe layer 41 that is formed on the antiferromagnetic layer 33b; a Ru layer 40 that is formed on the CoFe layer 41; a CoFeB layer 39 that is formed on the Ru layer 40; a tunnel barrier layer 38 that is formed on the CoFeB layer 39 and is made of MgO; a magnetization free layer 37 that is formed on the tunnel barrier layer 38 and is made of CoFeB; a cap layer 31b that is formed on the magnetization free layer 37; and an upper electrode 30b that is formed on the cap layer 31b. The stack-layer structure of the three layers of the CoFe layer 41, the Ru layer 40, and the CoFeB layer 39 forms an artificial ferri structure, and functions as a magnetization pinned layer. The magnetization M2 in the magnetization free layer 37 made of CoFeB oscillates with the magnetic resonance caused by the oscillating field 3 generated from the magnetization M1 of the oscillating field generating unit 1. The structure of the magnetoresistive element unit 2 formed with a ferromagnetic multi-layer film is an example of a TMR device structure having a tunnel barrier that is well known to have a high MR ratio and is made of MgO. The portion of the device formed with the CoFe layer 41, the Ru layer 40, the CoFeB layer 39, the tunnel barrier layer 38 made of MgO, the CoFeB layer 37, and the cap layer 31b is processed into an elliptical shape of 200 nm in long axis and 150 in short axis in the film plane. In this embodiment, the volume $V_2$ of the magnetization free layer 37 made of CoFeB is approximately $7.1 \times 10^4$ nm$^3$.

The film thickness of each layer in the oscillating field generating unit 1 and the magnetoresistive element unit 2 formed with a ferromagnetic multi-layer film in accordance with this embodiment is now described. First, as shown in FIG. 6, the lower electrodes 32a and 32b have the same film thicknesses. As for the respective layers above the lower electrodes 32a and 32b, the thickness of the antiferromagnetic layer 33a made of IrMn is 15 nm, the thickness of the magnetization pinned layer 36 made of CoFe is 12 nm, the thickness of the nonmagnetic spacer layer 35 made of Cu is 5 nm, and the thickness of the magnetization free layer 34 made of NiFe is 5 nm in the oscillating field generating unit 1. In the magnetoresistive element unit 2 formed with a ferromagnetic multi-layer film, the thickness of the antiferromagnetic layer 33b made of IrMn is 25 nm, the thickness of the CoFe layer 41 is 3 nm, the thickness of the Ru layer 40 is 0.85 nm, the thickness of the CoFeB layer 39 is 3 nm, the thickness of the tunnel barrier layer 38 made of MgO is 1.8 nm, and the thickness of the magnetization free layer 37 made of CoFeB is 3 nm. Accordingly, the magnetization free layer 34 made of NiFe in the oscillating field generating unit 1 and the magnetization free layer 37 made of CoFeB in the magnetoresistive element unit 2 are placed at substantially the same height, so that the distance r between the magnetization free layer 34 made of NiFe and the magnetization free layer 37 made of CoFeB is minimized, and the oscillating field generated from the magnetization M1 in the magnetization free layer 34 made of NiFe effectively acts on the magnetization M2 in the magnetization free layer 37 made of CoFeB. With this arrangement, the magnetization oscillation of the magnetization M1 of the magnetization free layer 34 has a Q value as high as $10^4$, and the oscillation of the magnetization M2 of the magnetization free layer 37 caused by the oscillating field 3 generated from the magnetization oscillation of the magnetization M1 also has a high Q value.

The thickness of the barrier layer 38 made of MgO in the magnetoresistive element unit 2 is 1.8 nm, which is relatively a large film thickness in today's MgO-TMR device technology. With this barrier layer 38, the MR ratio can be approximately 200%, even at room temperature. The barrier layer 38 can be formed to have 5 $\Omega\cdot\mu m^2$ in RA (areal resistance), and in this embodiment, the device resistance of the magnetoresistive element unit 2 formed with a ferromagnetic multi-layer film is approximately 212 $\Omega$.

As described in the seventh embodiment, a wire (not shown) is also buried in the vicinity of the magnetization free layer 34 made of NiFe in the oscillating field generating unit 1 of the spin-torque oscillator in accordance with this embodiment. By supplying a direct current flowing through the wire, the magnetostatic constant field acting on the magnetization M1 in the magnetization free layer 34 made of NiFe can be varied. With this wire (not shown), the magnetic resonance frequency of the magnetization M1 of the magnetization free layer 34 can be smoothly adjusted to the magnetic resonance frequency of the magnetization M2 in the magnetization free layer 37 made of CoFeB in the magnetoresistance element unit 2 formed with a ferromagnetic multi-layer film.

The oscillation of the magnetization M1 in the oscillating field generating unit 1 is now described. Today, it is generally believed that the magnetization oscillation mode seen in a spin-torque oscillator with a nano-scale contact is a mode that is adequately defined by the spin-wave theory, and in most cases, it is a spin-wave bullet mode. According to the findings made by the inventors through their studies over years, however, the spin-wave bullet mode is seen in a case where the magnetization free layer is a NiFe layer as in this embodiment, if the size R of the point contact is approximately 50 nm. If the size R is larger than 50 nm, some other oscillation mode, such as a clamshell mode, an in-plane mode, or an out-of-plane mode, is observed. It is known that those oscillation modes can be described by a simple single-domain magnetization model which is often used to examine the dynamics of an uniform magnetization. Therefore, those oscillation modes will be hereinafter referred to collectively as the uniform-magnetization oscillation mode. In the uniform-magnetization oscillation mode, the oscillation amplitude of the magnetization M1 is larger in terms of space average than in the spin-wave bullet mode. As a result, the oscillating field 3 having a large variation can be obtained. In the spin-torque oscillator in accordance with this embodiment, the size R is set at approximately 100 nm, so that the oscillating field 3 with a large variation can be obtained by taking advantage of the uniform-magnetization oscillation mode. The area excited in the magnetization free layer 34 made of NiFe in the oscillating field generating unit 1 by the current supplied from the DC power supply 13 is approximately 1.5×R, which is about 150 nm. Accordingly, the magnetic excitation volume $V_1$, is approximately $8.8 \times 10^4$ $nm^3$. The magnetic excitation volume $V_1$, which is the volume of the magnetization oscillating unit provided in the oscillating field generating unit 1, is larger than the volume $V_2$, which is the volume of the magnetization oscillating unit provided in the magnetoresistive element unit 2 formed with a ferromagnetic multi-layer film. With this arrangement, the oscillating field 3 can effectively act on the magnetization M2, and cause the magnetization M2 to oscillate.

The intensity $H_{osci}$ of the oscillating field acting on the magnetization M2 of the magnetization free layer 37 of the magnetoresistive element unit 2 is estimated to be $4\pi M_s V_1/r^3$, which is approximately 50 Oe in this case. Here, the value of the saturation magnetization $M_s$ is 800 $emu/cm^3$, which is a typical value in the case of permalloy (NiFe). Although it is very difficult to precisely estimate the magnetostatic constant field acting on the magnetization M2, the magnetostatic constant field $H_0$ in this case is assumed to be 1000 Oe, which is also a typical value. The oscillation angle $\Delta\theta$ of the magnetization M2 with the oscillation $H_{osci}$ can be evaluated by the following equation:

$$\Delta\theta \approx \arcsin\left(\frac{M_\perp}{M_S}\right) \times \frac{180°}{\pi} \qquad (2)$$
$$= \arcsin\left(\frac{1}{2\alpha}\frac{H_{osci}}{\omega_0/\gamma}\right) \times \frac{180°}{\pi}$$

Here, $\alpha$ represents the Gilbert damping factor, which is 0.01, and $\gamma$ represents the gyromagnetic ratio, which is $1.76 \times 10^7$ [1/Oe·sec]. Meanwhile, $\omega_0$ represents the oscillation frequency of the magnetization M2 and the oscillating magnetic field, and the following equation is satisfied:

$$\frac{\omega_0}{\gamma} = \sqrt{H_0(H_0 + 4\pi M_s)} \approx 3325 \text{ [Oe]}$$

According to the equation (2), the oscillation angle $\Delta\theta$ is estimated to be approximately $0.271\pi$.

In a case where the input current supplied from the DC power supply 12 to the magnetoresistive element unit 2 formed with a ferromagnetic multi-layer film is 0.5 mA, the current density of the current flowing into the stack film formed with the CoFe layer 41, the Ru layer 40, the CoFeB layer 39, the barrier layer 38 made of MgO, the CoFeB layer 37, and the cap layer 31b is approximately $2.1\times10^6$ $A/cm^2$ ($<10^7$ $A/cm^2$). The spin transfer effect between the CoFeB layer 39 and the CoFeB layer 37 via the tunnel barrier layer 38 made of MgO is small. Accordingly, most of the spin transfer noise for the oscillation of the magnetization M2 can be ignored. In the case where the input current is 0.5 mA, the bias voltage to be applied to the tunnel barrier layer 38 made of MgO is approximately 0.11 V, and the film thickness of the barrier layer 38 made of MgO is 1.8 nm. Accordingly, the electric field induced in this case can be estimated to be approximately 0.06 V/nm. This electric field is sufficiently smaller than the electric field of 1 V/nm, which is a limit value for a dielectric breakdown. With this electric field, a dielectric breakdown is not caused in the tunnel barrier layer 38 made of MgO. With the input current of 0.5 mA, the input power $P_{in}$ is expressed as: $P_{in}$=212$\Omega$×(0.5 mA)$^2$=53 $\mu$W.

Also, since the MR ratio is approximately $(R_{AP}-R_p)/R_p=200\%$, the oscillation power P is estimated to be as follows:

$$P=(MR/2)^2 \times P_{in} \times (1-\cos\Delta\theta)^2 \times \frac{1}{2}, \text{ which is approximately 3 } \mu W$$

The factor ½ in this equation is derived from the time average. As can be seen from the form of each equation, the oscillation power can be quadrupled, when the input current is doubled, for example. However, if the input current is too large, the problem of spin transfer noise or the problem of a dielectric breakdown is caused. Therefore, there is a limit to the input current. Still, a microwatt oscillation output of at least 3 μW, which is a practical value, can be obtained.

As described above, it is possible to obtain a Q value of approximately $10^4$ and a power P of at least 3 μW, which is a high output, from the spin-torque oscillator in accordance with this embodiment. In other words, the spin-torque oscillator in accordance with this embodiment has the advantages of a conventional GMR oscillation device and a conventional TMR oscillation device, and can achieve a high output with a high Q value.

Modification

Figure 7:
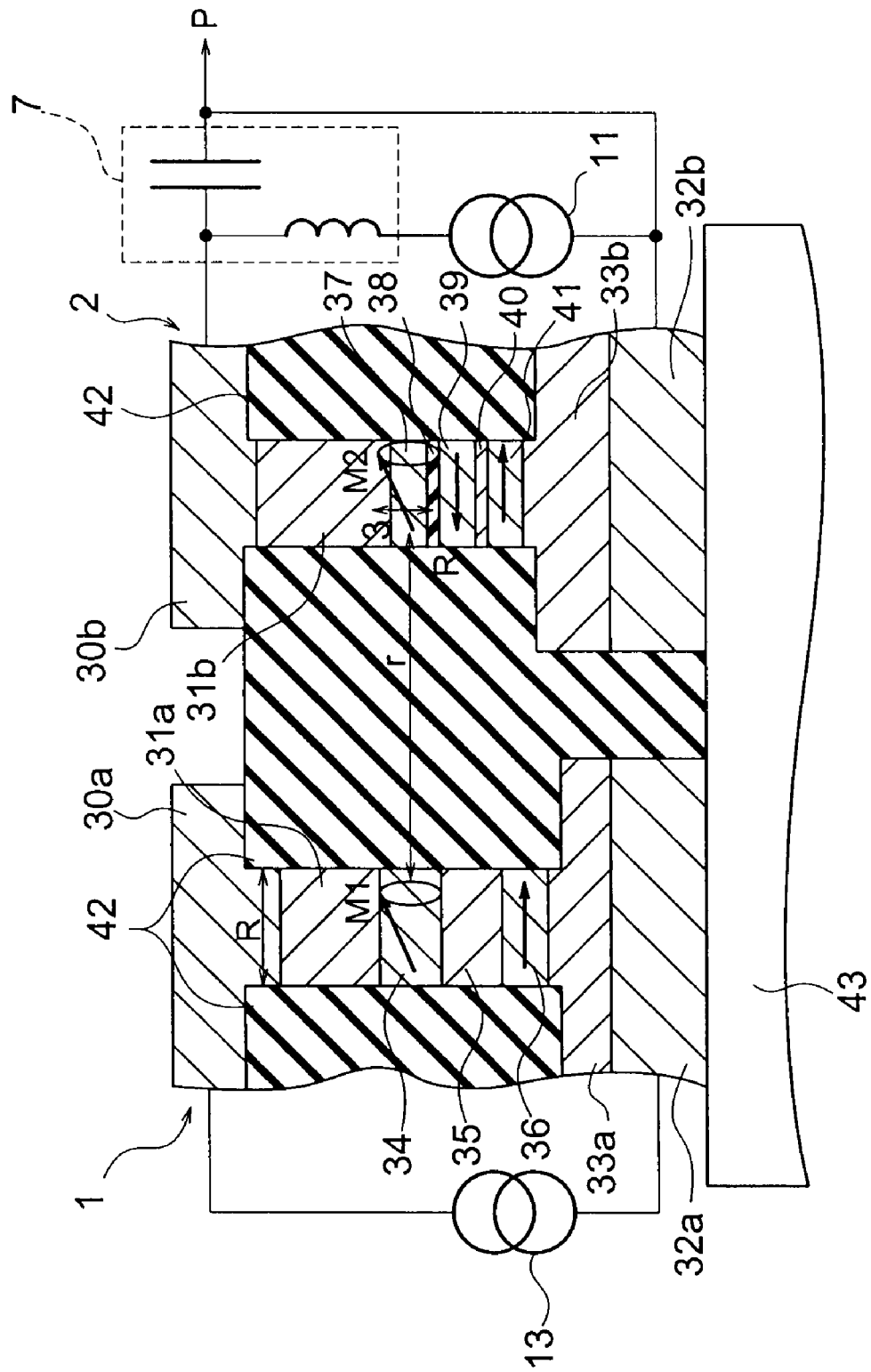
FIG. 7 is a schematic view of a spin-torque oscillator in accordance with a modification of the eighth embodiment.

Referring now to FIG. 7, a spin-torque oscillator in accordance with a modification of this embodiment is described. The spin-torque oscillator of this modification differs from the spin-torque oscillator of the eighth embodiment shown in FIG. 6 only in the shape of the oscillating field generating unit 1, and there are no differences in structure, film thicknesses, and materials. More specifically, the oscillating field generating unit 1 of the eighth embodiment is of a point contact type, and the upper electrode 30a is in point-contact with the cap layer 31a. On the other hand, the oscillating field generating unit 1 of this modification is of a pillar type, and the cap layer 31a serves as the pillar of the upper electrode 30a.

In this modification, the spin-wave bullet mode does not appear, and the uniform-magnetization oscillation mode is mostly observed, as in the eighth embodiment.

The spin-torque oscillator in accordance with this modification has the advantage that the device size can be reduced. On the other hand, the spin-torque oscillator of the eighth embodiment shown in FIG. 6 has the advantage that the oscillation field generating unit 1 is easy to produce, as the oscillation field generating unit 1 does not need to be processed into a pillar shape through processes such as a milling process or lift-off process.

Like the eighth embodiment, this modification can also achieve a high Q value and a high output.

Ninth Embodiment

A magnetic recording and reproducing apparatus in accordance with a ninth embodiment of the present invention is now described. Any of the spin-torque oscillators in accordance with the first to eighth embodiments and their modifications illustrated in FIGS. 1 to 7 can be mounted on the magnetic recording and reproducing apparatus.

Figure 8:
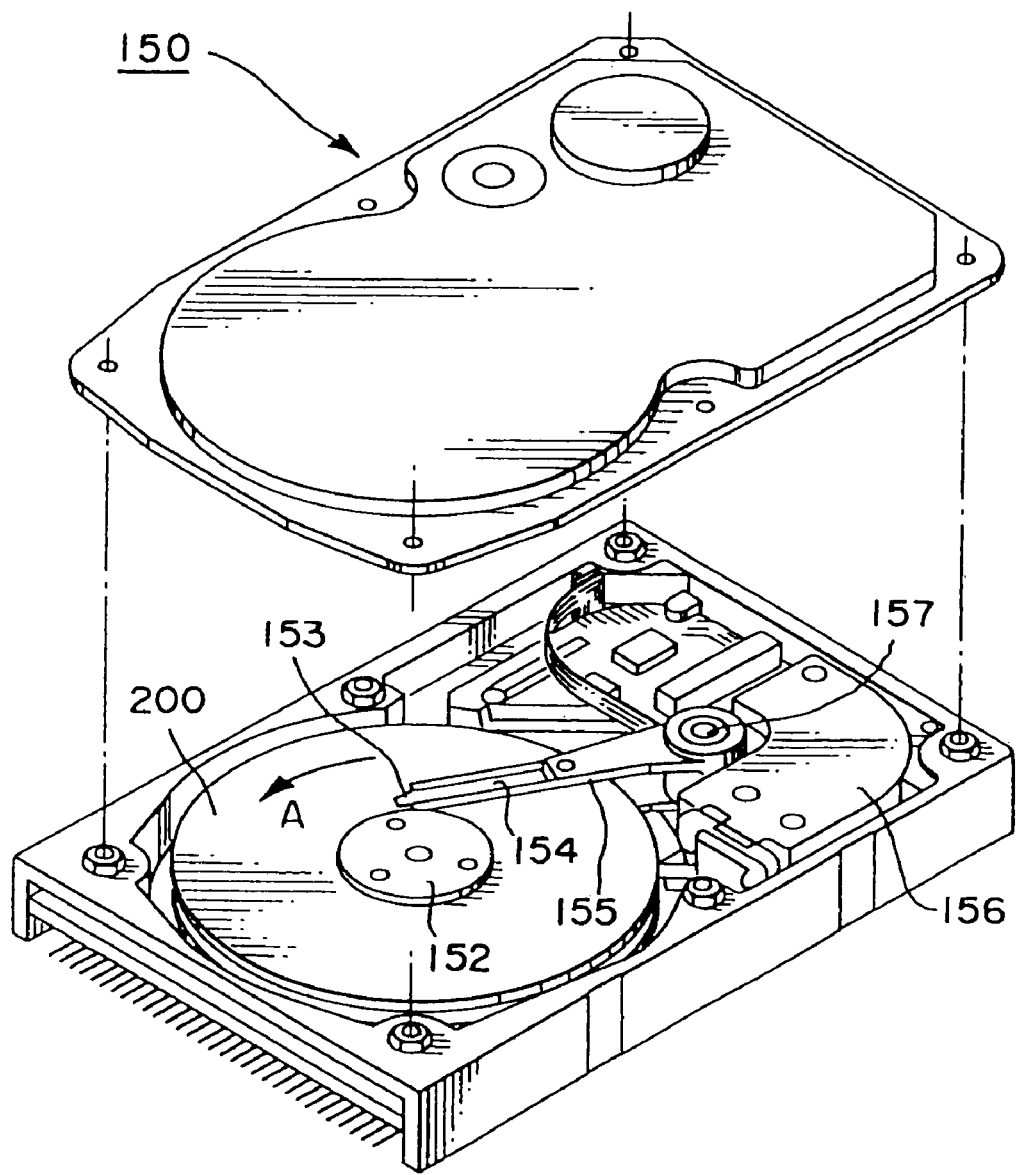
FIG. 8 is a perspective view of a magnetic recording and reproducing apparatus in accordance with a ninth embodiment.

FIG. 8 is a perspective view schematically showing the structure of the magnetic recording and reproducing apparatus. More specifically, the magnetic recording and reproducing apparatus 150 of this embodiment is a type of apparatus that includes a rotary actuator. In FIG. 8, a perpendicular recording magnetic disk 200 is attached to a spindle 152, and revolves in the direction of the allow A with a motor (not shown) that responses to a control signal supplied from a drive unit controller (not shown). A head slider 153 that performs recording and reproducing of the information stored in the magnetic disk 200 is attached to the top end of a thin-film magnetic suspension 154. The head slider 153 has a magnetic head mounted onto the top end region. The magnetic head includes one of the spin-torque oscillators of the above described embodiments and modification as a reproducing device that senses a magnetic field on a medium or the magnetic disk 200 and reproduces the information.

As the magnetic disk 200 revolves, the medium facing surface (ABS) of the head slider 153 is held in a floating position that is at a predetermined distance from the surface of the magnetic disk 200.

The suspension 154 is connected to one end of an actuator arm 155 that has a bobbin unit for holding a drive coil (not shown) and the likes. A voice coil motor 156 that is a type of linear motor is provided at the other end of the actuator arm 155. The voice coil motor 156 includes the drive coil (not shown) that is wound up by the bobbin unit of the actuator arm 155, and a magnetic circuit that has a permanent magnet and a facing yoke arranged to face each other, with the drive coil being interposed between the permanent magnet and the facing yoke.

The actuator arm 155 is held by ball bearings (not shown) provided at an upper portion and a lower portion of a fixed shaft 157. The voice coil motor 156 allows the actuator arm 155 to freely slide in a revolving manner.

Figure 9:
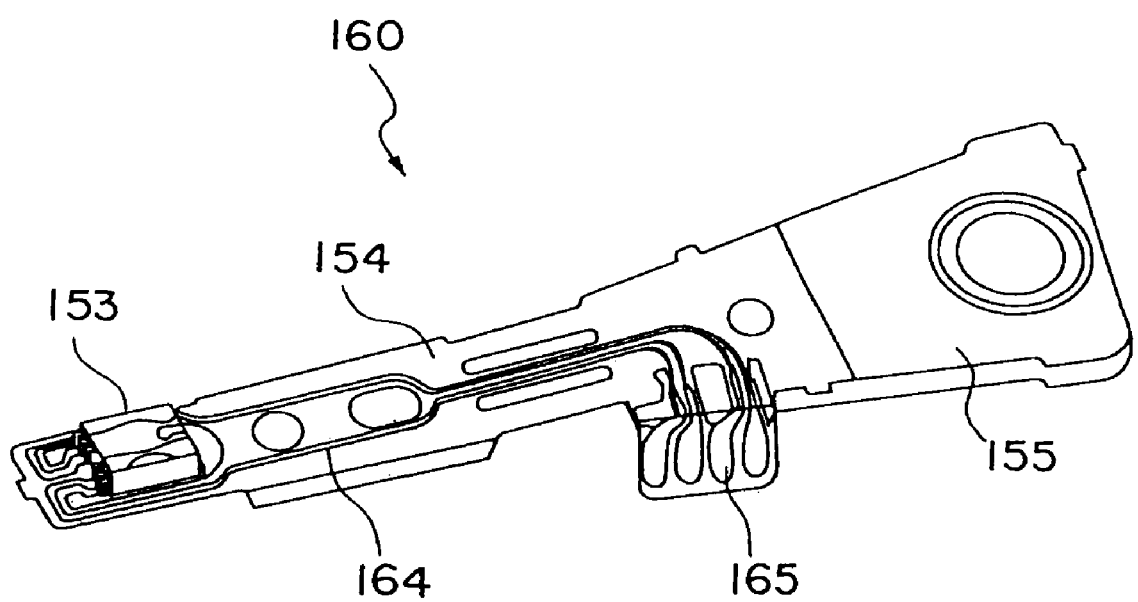
FIG. 9 is a perspective view of the magnetic head assembly including the actuator arm of the magnetic recording and reproducing apparatus of the ninth embodiment.

FIG. 9 is an enlarged perspective view of the magnetic head assembly including the actuator arm 155, seen from the disk side. The magnetic head assembly 160 includes the actuator arm 155 that has the bobbin unit for holding the drive coil and the likes, and the suspension 154 is connected to one end of the actuator arm 155.

The head slider 153 including the magnetic head is attached to the top end of the suspension 154. The suspension 154 has a lead wire 164 for writing and reading signals. The lead wire 164 is electrically connected to each of the electrodes of the magnetic head incorporated into the head slider 153. Reference numeral 165 in FIG. 9 indicates the electrode pads of the magnetic head assembly 160. Here, the predetermined distance is kept between the medium facing surface (ABS) of the head slider 153 and the surface of the magnetic disk 200.

The medium field sensor of a conventional reproducing head is formed with a MR device such as a GMR device or a TMR device. In the reproducing head employed in the magnetic recording and reproducing apparatus of this embodiment, on the other hand, one of the spin-torque oscillators of the first to eighth embodiments and the modification is used as the medium field sensor. In a conventional reproducing head, changes in amplitude of the MR device output are detected to read the magnetic information recorded on a medium. In the reproducing head employed in the magnetic recording and reproducing apparatus of this embodiment, on the other hand, changes in the oscillation frequency of the spin-torque oscillator are detected to read magnetic information, as the oscillation frequency of the spin-torque oscillator varies with the magnetic field on the medium. A "reproducing head that performs magnetic information reproduction by detecting frequency with the use of a spin-torque oscillator" is a known concept, and such a reproducing head is considered to be one of the reproducing heads that can realize high-SNR signal reproduction resistant to thermal noise in the generation of high-density recording of 1 terabits/inch$^2$ or higher, as smaller-sized reproducing heads will be developed in the future. In the reproducing head of this embodiment that performs magnetic information reproduction by detecting the frequency with the use of the spin-torque oscillator, the reproduction signal output is of the order of realistic microwatts, and the frequency resolution is high with the stable oscillation state, because the spin-torque oscillator of one of the first to eighth embodiments has higher outputs and higher Q values than a conventional spin-torque oscillator.

As described so far, the present invention can provide a spin-torque oscillator that achieves a high Q value and a high output, a magnetic head that includes the spin-torque oscillator, and a magnetic recording and reproducing apparatus.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A spin-torque oscillator comprising:
   an oscillating field generating unit provided on a substrate and configured to generate an oscillating field, the oscillating field generating unit being a CPP-GMR device that includes a first stacked structure, the first stacked structure comprising a first magnetization pinned layer of which a magnetization direction is pinned, a first magnetization free layer of which a magnetization direction oscillates, and a spacer layer made of a nonmagnetic metal and interposed between the first magnetization pinned layer and the first magnetization free layer;
   a magnetoresistive element provided on the substrate and electrically insulated from the oscillating field generating unit, the magnetoresistive element including a magnetoresistive effect film comprising a second magnetization pinned layer of which a magnetization direction is pinned, a second magnetization free layer of which a magnetization direction oscillates with the oscillating field, and a tunnel barrier interposed between the second magnetization pinned layer and the second magnetization free layer;
   a first power supply configured to supply a current to the oscillating field generating unit, so as to cause the oscillating field generating unit to generate the oscillating field;
   a second power supply configured to supply a current to the magnetoresistive effect film of the magnetoresistive element; and
   a microwave extracting circuit configured to extract microwave that is output from the magnetoresistive effect film of the magnetoresistive element.

2. The oscillator according to claim 1, wherein the first magnetization free layer of the CPP-GMR device has a larger volume than a volume of the second magnetization free layer of the magnetoresistive effect film.

3. The oscillator according to claim 1, further comprising a magnetostatic field generating unit placed in the vicinity of the first magnetization free layer, and configured to generate a magnetostatic field for changing frequency of the microwave.

4. A magnetic head comprising
   a spin-torque oscillator according to claim 1,
   the spin-torque oscillator serving as a reproducing device.

5. A magnetic recording and reproducing apparatus comprising a disk driver driving a magnetic disk, and a magnetic head according to claim 4.

6. The oscillator according to claim 1, further comprising:
   a lower electrode provided under the first stacked structure;
   an upper electrode provided above the first stacked structure; and
   an insulating layer provided between the first stacked structure and the upper electrode, the insulating layer comprising a point contact connecting between the first stacked structure and the upper electrode.

7. The oscillator according to claim 1, wherein the second magnetization pinned layer comprises a first magnetic layer, a second magnetic layer, and a nonmagnetic layer, the first magnetic layer and second magnetic layer being magnetically coupled via the nonmagnetic layer.

* * * * *